United States Patent [19]
Jasper et al.

[11] 4,445,223
[45] Apr. 24, 1984

[54] APPARATUS AND METHOD FOR DETERMINING THE PRESENCE AND FREQUENCY OF A PERIODIC SIGNAL

[75] Inventors: Steven C. Jasper, Schaumburg; Robert V. Janc, Palos Heights; David S. Robins, Buffalo Grove; Michael H. Retzer, Schaumburg, all of Ill.

[73] Assignee: Motorola, Inc., Schaumburg, Ill.

[21] Appl. No.: 222,422

[22] Filed: Jan. 5, 1981

[51] Int. Cl.³ .............................................. H03K 3/78
[52] U.S. Cl. ..................................... 375/96; 364/728; 343/389
[58] Field of Search .............. 375/1, 82, 96, 115; 370/107; 364/484, 728, 819, 449, 452; 343/103, 100 CL

[56] References Cited

U.S. PATENT DOCUMENTS

| | | | |
|---|---|---|---|
| 3,045,916 | 7/1962 | Downes | 364/819 |
| 3,359,409 | 12/1967 | Goldstein | 364/728 |
| 3,700,876 | 10/1972 | Gray | 328/165 |
| 3,916,320 | 10/1975 | Roll et al. | 328/165 |
| 3,961,172 | 6/1976 | Hutcheon | 364/819 |
| 4,010,421 | 3/1977 | Lind | 179/15 BS |
| 4,025,775 | 5/1977 | Beauvais et al. | 328/134 |
| 4,038,540 | 7/1977 | Roberts | 364/728 |
| 4,134,117 | 1/1979 | Robinson et al. | 343/103 |
| 4,135,243 | 1/1979 | Peregrino et al. | 364/484 |
| 4,206,320 | 6/1980 | Keasler et al. | 375/96 |
| 4,253,189 | 2/1981 | Lemoussu et al. | 375/96 |
| 4,346,475 | 8/1982 | Alexis | 364/728 |

Primary Examiner—Robert L. Griffin
Assistant Examiner—Stephen Chin
Attorney, Agent, or Firm—Mark P. Kahler; Edward M. Rooney; James W. Gillman

[57] ABSTRACT

An apparatus and method for determining the period and frequency of a signal intefering with a desired Loran C signal are provided. A sample of the interfering signal is generated at a time corresponding to the peak of the autocorrelation function of the interfering signal with respect to the predetermined pulse tracking reference point of the Loran C signal. Indicia of the period and frequency of the interferer is obtained from the timing of the sample generated at the autocorrelation function peak.

18 Claims, 11 Drawing Figures

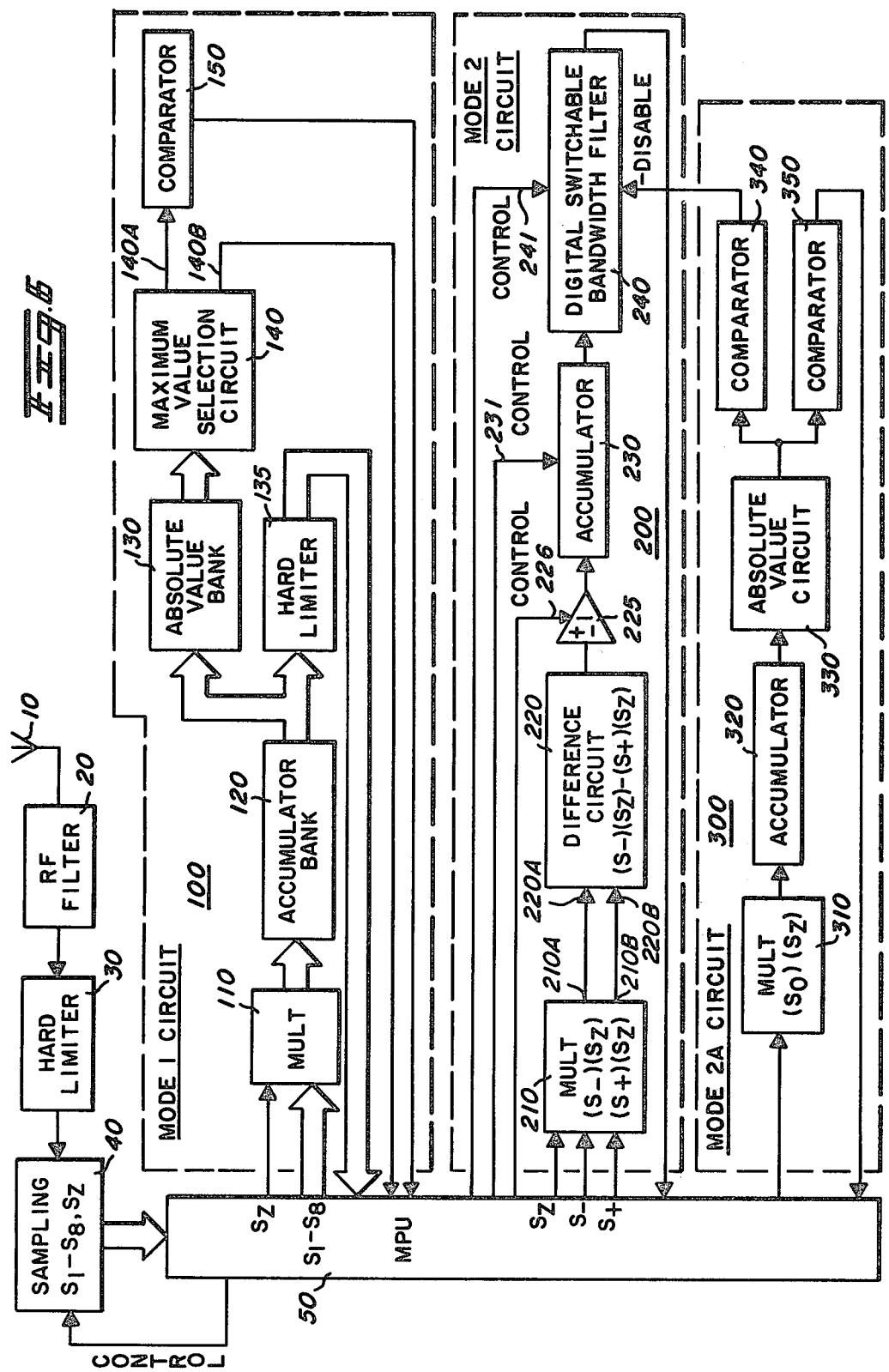

APPARATUS AND METHOD FOR DETERMINING THE PRESENCE AND FREQUENCY OF A PERIODIC SIGNAL

BACKGROUND OF THE INVENTION

This invention relates to systems for determining the presence and frequency of a periodic signal and, more particularly, to apparatus for determining the presence and frequency of an undesired radio frequency signal interfering with a Loran C radionavigation signal.

DESCRIPTION OF THE PRIOR ART

Loran C is a radionavigation system employed in the low frequency portion of the radio spectrum at a carrier frequency of 100 kHz. The Loran C radionavigation scheme consists of a chain of master and secondary stations situated at different selected locations and transmitting on the same frequency but at different times. The master station and each of the secondary stations (of which there are at least two) transmit a series of eight closely and equally spaced radio frequency pulses designated pulse groups. In addition to the eight pulses, the master station transmits a ninth pulse shortly after its eighth pulse for identification purposes. Each master or secondary station repeats the pulse group it transmits at the group repetition interval (GRI) for that chain. The master station provides the time reference for the remaining stations in the chain. The master station transmits its pulse group first and is followed in time by a pulse group transmission from the first secondary station and then a pulse group transmission from the second secondary station. This sequence of transmission of pulse groups is continuously repeated. The transmission of pulse groups by the secondary stations is sufficiently delayed in time such that there is no overlap in pulse group transmission or reception anywhere in the coverage area of the particular Loran C chain.

To determine the location or fix of a receiving station located within the Loran C coverage area, a Loran C receiver is synchronized to the group repetition interval at which the master and secondary stations of a selected chain transmit. The time difference (TD) is defined as the time of arrival at the receiving station of the secondary station pulse group minus the time of arrival of the master station pulse group. A time difference is thus determined for each of the secondary stations with respect to the master station. Each of these time differences corresponds to a different hyperbolic line of position (LOP). A line of position is defined to be an imaginary line on the surface of the earth exhibiting a constant difference of distance from the master station and a selected secondary station. More specifically, a line of position corresponds to a constant difference in propagation time from the master station and a selected secondary station. Thus, in a Loran C chain having a master station and two secondary stations, two lines of position may be determined. The point at which these two lines of position intersect represents the location of the receiving station site.

Loran C receivers must often function in a high noise environment in which interfering signals appear. To attenuate such an undesired interfering signal it is necessary to determine the frequency of the interfering signal prior to or simultaneously with attenuating the signal. One conventional scheme for determining the frequency of an interferer and simultaneously attenuating the same employs a tunable notch filter in the front end of a Loran C receiver. A metering circuit within the receiver permits the receiver operator to observe the amplitude of the interfering signal. The operator manually tunes the passband of the notch filter until the interference as indicated on a meter type readout reaches a minimum.

Another conventional approach for determining the frequency of an interfering signal within the Loran C signal bandwidth employs a voltage controlled oscillator phase locked to the undesired signal. The frequency and phase of the interfering signal are thus automatically tracked without operator intervention.

It is one object of the present invention to determine indicia of the frequency of a signal interfering with a desired Loran C signal without manual action by the receiver operator.

It is another object of the present invention to accurately determine indicia of the frequency of an interfering signal even if such interfering signal exhibits a frequency substantially the same as the Loran C signal.

These and other objects of the invention will become apparent to those skilled in the art upon consideration of the following description of the invention.

SUMMARY OF THE INVENTION

The present invention is directed to determining indicia of the frequency of a radio frequency signal which is interfering with a desired Loran C signal. It is, however, noted that the invention may be employed to determine the frequency of virtually any signal exhibiting a periodic waveform.

In accordance with one embodiment of the invention, apparatus for determining the frequency of a first radio frequency signal includes a receiver for receiving the first signal. A sampling circuit is coupled to the receiver to sample the first signal at a predetermined number of points in time sufficient to enable determination of a selected number of autocorrelation function values of the autocorrelation function of the first signal. An autocorrelation function value generator is coupled to the sampling circuit and generates a plurality of autocorrelation function values from the samples of the first signal taken by the sampling circuit. A selecting circuit or comparator is coupled to the autocorrelation function function generator. The selecting circuit operates in a first mode to determine the autocorrelation value having the largest magnitude. The time associated with such autocorrelation value of largest magnitude exhibits indicia of the frequency of the first signal.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

BRIEF DESCRIPTION OF THE DRAWINGS

FIG. 6 is a block diagram of apparatus for determining the frequency of a radio frequency signal interfering with a Loran C signal.

DESCRIPTION OF THE PREFERRED EMBODIMENT

Figure 1A:
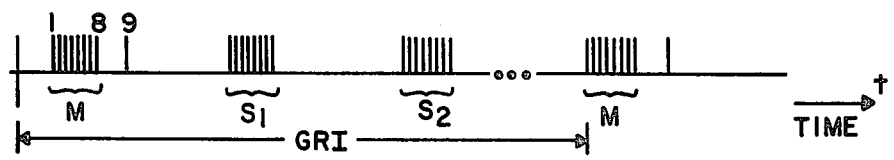
FIG. 1A shows typical pulse groups respectively transmitted by a master station and first and second secondary stations.

FIG. 1A illustrates the typical time relationship of the Loran C master station signal and the associated secondary station signals. The master station signal is shown conveniently as a group of eight radio frequency pulses, each pulse being represented by a vertical line. The carrier frequency of the eight pulses which together comprise a pulse group is typically 100 kHz. The spectrum of the Loran C signal is substantially within the range of 90 through 110 kHz. It is seen that subsequent to transmission of the master station pulse group (shown as M), the eight pulses of the first secondary station pulse group (shown as $S_1$) are transmitted. More specifically, the $S_1$ pulse group is transmitted a predetermined amount of time after transmission of the master station pulse group (M). The second secondary station commences transmission of the eight pulses of the second secondary station pulse group ($S_2$) a predetermined amount of time after transmission of the $S_1$ pulse group by the first secondary station. As shown in FIG. 1A, this sequence of transmission in which the master station transmits first followed in time by the first and second secondary stations continues ad infinitum. In actual practice, a ninth pulse follows the first eight pulses of the master station pulse group to readily distinguish the master station signal from those of the secondary stations when such signals are observed manually, for example, on a cathode ray tube type display. The time differences (TD) of these master station pulse groups with respect to each of the secondary station pulse groups yields the lines of position which determine the fix of a Loran C receiving station.

Figure 1B:
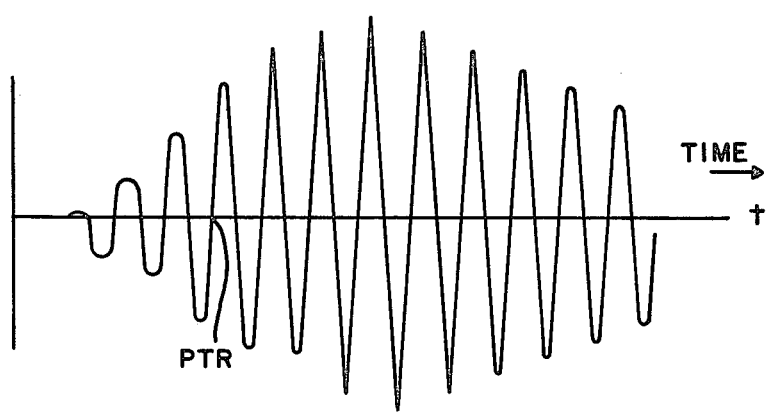
FIG. 1B shows a typical Loran C pulse.

FIG. 1B is an expanded representation of one of the Loran C pulses of FIG. 1A.

Figure 2:
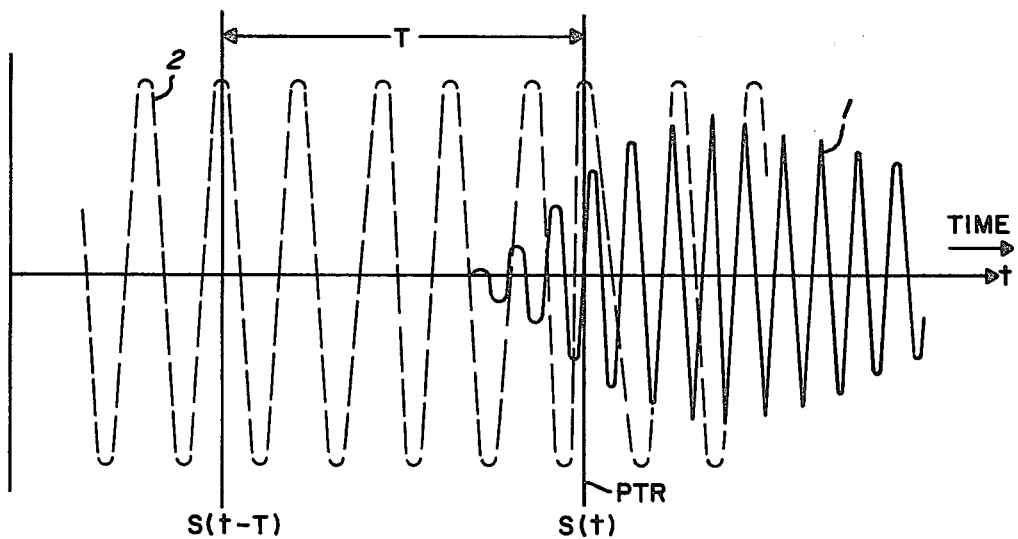
FIG. 2 shows a typical Loran C pulse corrupted by a narrowband interfering signal.

FIG. 2 shows a typical single pulse 1 of a Loran C pulse group corrupted by a narrowband interfering signal 2. For purposes of example, the interfering signal is shown as having a frequency approximately the same as that of the carrier of the selected Loran C pulse. The third positive zero crossing of each pulse of a pulse group is designated the pulse timing reference (or PTR as shown). In Loran C receiving systems it is important that the times at which the PTR's of the Loran C signals received from the master and secondary stations be accurately determined because the time differences used to determine the lines of position are actually the differences in time at which the PTR's of different station pulse groups are received.

In accordance with the method of the present invention, a phase lock loop circuit or the equivalent thereof is used to track the respective PTR's of the master, first secondary and second secondary Loran C stations. To determine the frequency of the interfering signal 2, the autocorrelation function of the interfering signal 2 is determined. To accomplish such autocorrelation function determination, a sample of each received pulse of a particular pulse group is taken at the current PTR or at the receiver's best estimate thereof. This sample at the PTR is designated S(t) and is shown in FIG. 2. It is noted that the value of a Loran C pulse at the receiver's PTR estimate thereof is very nearly equal to zero and thus the value of the PTR sample S(t) depends totally on the value of the interfering signal 2 and received noise. At a time T seconds away from and prior to both the sample S(t) and the pulse 1, another sample of the interfering signal 2 is taken and is designated S(t−T). The autocorrelation function value R(T) of the interfering signal 2 equals the expected value of the product of the two samples S(t) and S(t−T). The autocorrelation function value R(T) is approximated after N pulses by the following equation:

$$R(T) = \frac{1}{N} \sum_{1}^{N} S(t) \cdot S(t - T) \qquad \text{Equation 1}$$

wherein N is a predetermined number of Loran C pulses. The received Loran C signal 1 and the interfering signal 2 are hard-limited such that whenever such signals exhibit positive or negative excursions, corresponding signals of +1 or −1 are respectively generated. Thus the average expressed in Equation 1 is determined without difficulty because the terms of the product S(t)·S(t−T) equal ±1 and thus the product itself equals ±1.

Figure 3:
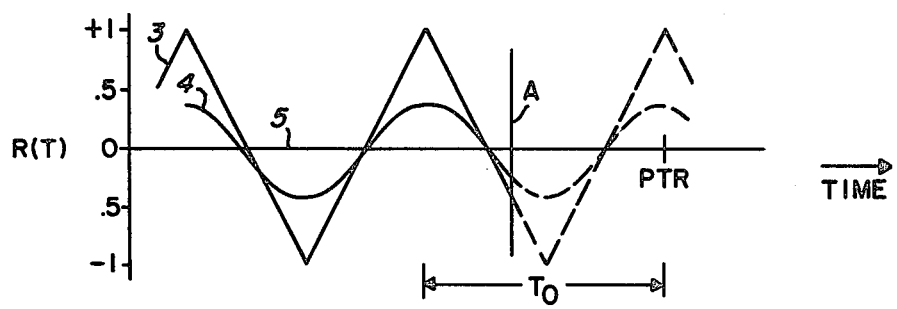
FIG. 3 shows the autocorrelation function of the interfering signal with respect to a selected point in time of the desired Loran C signal.

FIG. 3 shows a time versus amplitude graph of the autocorrelation function of the interfering signal 2 of FIG. 2. The dashed portion of the graph to the right of the solid vertical line A indicates the portion of the autocorrelation function of the interfering signal occurring within the Loran C pulse. It is noted that the amplitude of the peaks of the autocorrelation function of the interfering signal vary in a manner proportional to the ratio of such interfering signal to received noise. The autocorrelation functions of three interfering signals with different ratios of interfering signal to received noise are plotted in FIG. 3. More specifically, the autocorrelation function of a relatively strong interfering signal is shown in FIG. 3 as autocorrelation function 3. Function 3 exhibits a triangle wave pattern due to the large amplitude of the corresponding interfering signal. Stated alternatively, an interfering signal with a high interference-to-noise ratio (INR) results in a triangle wave type autocorrelation function. A typical INR value for a high amplitude interfering signal is 30 dB. The autocorrelation function of an interfering signal having an INR of 0 dB is shown in FIG. 3 as autocorrelation function 4. It is noted that the autocorrelation function 4 is periodic; however, the peaks of such function are more rounded than those of triangle wave type autocorrelation function 3. Of course, when an interfering signal is not present, that is INR equals −∞, the autocorrelation function equals zero and is designated 5.

When an interfering signal is present, the autocorrelation function R(T) is periodic with period equal to $T_\phi$. The period $T_\phi$ of the autocorrelation function equals the period of the interfering signal. Thus, if the period $T_\phi$ of the autocorrelation function of the interfering signal is known, the frequency of the interfering signal may be determined via the mathematical relationship $f = 1/T_\phi$ where $f$ equals frequency. To reiterate, the method of the invention determines the autocorrelation function of the interfering signal and and the period of such autocorrelation function. Knowledge of the period of the autocorrelation function is equivalent to knowledge of the period of the interfering signal and thus the frequency of the interfering signal is determined.

Figure 4:
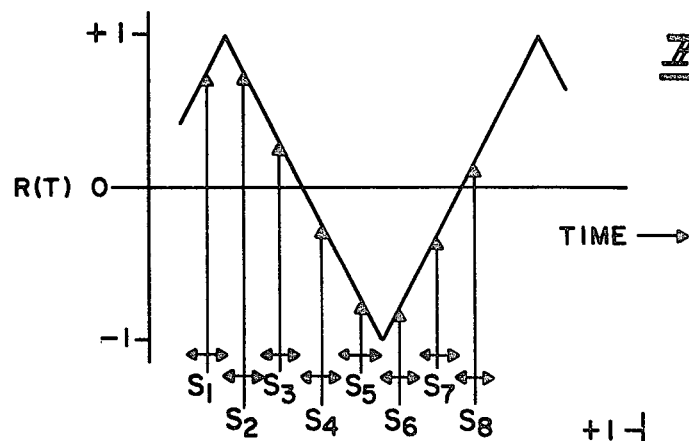
FIG. 4 illustrates peaks in the autocorrelation function curve of the interfering signal and various samples taken near such peaks.

To accurately determine the waveform of the autocorrelation function of the interfering signal, a plurality of samples $S(t-T)$ are taken at a plurality of times T prior to the sample $S(t)$ but not during the Loran C pulse. Alternatively, the $S(t-T)$ samples are taken after each $S(t)$ sample but not during the Loran C pulse. The sample $S(t)$ is taken during each Loran C pulse at a predetermined point in time, preferably at the PTR for reasons to be discussed henceforth. If only one sample $S(t-T)$ were taken for each Loran C pulse, it would take an inordinately large amount of time to determine the autocorrelation function of the interfering signal. Thus, as shown in FIG. 4, a first set comprised of a plurality of $S(t-T)$ interfering signal samples are taken at different equally spaced points in time prior to or after each Loran C pulse. FIG. 4 shows eight $S(t-T)$ samples designated $S_1$ through $S_8$. These $S(t-T)$ samples are stored in appropriate memory apparatus. The structure employed to implement the method of the invention will be discussed later in full detail. A second set of $S(t-T)$ samples shifted in time (signified by horizontal arrows in FIG. 4) may be taken for each Loran C pulse to speed up the determination of the autocorrelation function of interfering signal 2.

Although the method of the invention performs well to determine the frequency of a signal interfering with a Loran C signal, it is stressed that the method may be employed to determine the frequency of virtually any periodic signal. However, when the method of the invention is employed to determine the frequency of a signal interfering with a Loran C signal, the $S(t)$ sample must be taken at a selected zero crossing of a Loran C pulse, preferably at the PTR of each Loran C pulse. That is, the $S(t)$ sample taken during a Loran C pulse must occur at a time when the instantaneous value of the Loran C pulse is very nearly equal to zero. This is necessary such that the value of the $S(t)$ sample is dependent only on the interfering signal and received noise. Under this condition the average $S(t)$ sample is not dependent on the Loran C signal and the corresponding autocorrelation function values with respect to this $S(t)$ sample are likewise independent of the Loran C signal and dependent substantially only on the interfering signal and received noise.

The foregoing discussion briefly shows how the autocorrelation function of an interfering signal is determined and employed to find the frequency of an interfering signal or information equivalent thereto. Now, the method of the invention for determining the autocorrelation function and the frequency of the interfering signal is discussed in greater detail. The method of the present invention is operative in a first mode (mode 1), that is, an initial sense mode for detecting the presence of an interfering signal having a magnitude greater than a preselected signal strength (or INR). As discussed above, the interfering signal is sampled at a plurality of different times T prior to or after each $S(t)$ sample to form a plurality or set of samples $S(t-T)$. The $S(t)$ sample and the set of $S(t-T)$ samples are taken for each Loran C pulse. After a predetermined number (N) of Loran C pulses have been sampled, the autocorrelation function value $R(T)$ corresponding to each of the plurality of T's in the sample set is determined by employing Equation 1. The autocorrelation function value $R(T)$ having the largest absolute value (that is, most nearly equal to $+1$) is selected from the group of autocorrelation function values thus generated. The absolute value of the largest autocorrelation function value thus selected is compared with a predetermined threshold. If the largest autocorrelation function value exceeds this threshold, interference is deemed to have been detected and a second mode (mode 2) is initiated. Otherwise, the first mode continues such that another set of autocorrelation function values are determined for the next group of N pulses. This interference threshold is conveniently set to be 0.4. Greater or smaller values for the interference threshold may be employed depending upon the degree of sensitivity which is desired for a particular amount of interference. The number of Loran C pulses N comprises an averaging period over which the autocorrelation function values according to Equation 1 are determined. The value N is selected to be sufficiently small to achieve satisfactory speed in determination of the autocorrelation function values and sufficiently large to result in substantial accuracy of determination of the autocorrelation function values. Determination of the value of N is discussed in more detail subsequently.

Figure 5A:
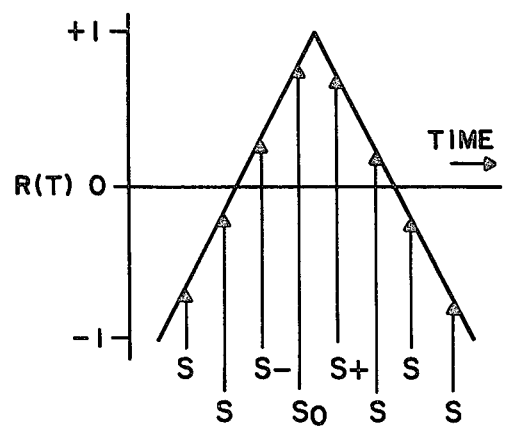
FIG. 5A shows a peak of the autocorrelation function of the interfering signal and samples taken near such peak.

To reiterate, when for a given group of N Loran C pulses, the absolute value of the largest autocorrelation function value $R(T)$ for such group of pulses exceeds the predetermined threshold, interference is said to be detected. The particular T corresponding to such largest autocorrelation function value is stored in an appropriate memory, as will be described in the subsequent discussion of FIG. 6 which shows apparatus for carrying out the invention. Upon such determination that interference is present, a mode 2 (second mode), which may be likened to a fine tuning mode, is commenced. The value T corresponding to the largest autocorrelation function value determined in mode 1 yields a coarse estimate of the frequency of the interfering signal because such T corresponds roughly to a peak in the autocorrelation function and thus corresponds to the period of the autocorrelation function. In the second mode of the frequency of the interferer is more accurately determined. The $S(t-T)$ sample of the interfering signal which resulted in the maximum autocorrelation function value in mode 1 is henceforth referred to as $S_\phi$. As seen in FIG. 5A, sample $S_\phi$ by definition is the sample of the interfering signal closest to the peak of the autocorrelation function. In accordance with the method of the invention, in mode 2 a set of at least two equally spaced in time sampling strobes are situated on each side of (before and after) the maximum sampling strobe $S_\phi$ and are designated $S_-$ and $S_+$, respectively. $S_z$ is the sampling strobe at the current estimate of the PTR of each Loran C pulse (heretofore referred to as $S(t)$). The sampling strobes $S_-$ and $S_+$ are referred to as auxiliary strobes and, for convenience, may be some of the same strobes (now designated S in FIG. 5A) as in those employed in the first mode. The timing of the $S_-$, $S_\phi$ and $S_+$ strobes is varied until the middle sample, $S_\phi$, occurs at the peak of the autocorrelation function of the interfering signal. When this condition is achieved, the T associated with the $S_\phi$ sample (the time interval between the $S_z$ and the $S_\phi$ samples) equals an integer multiple of half periods of the autocorrelation function of the interfering signal and thus equals an integer multiple of half periods of the interfering signal. Thus, indicia of the frequency of the interfering signal is derived.

Figure 5B:
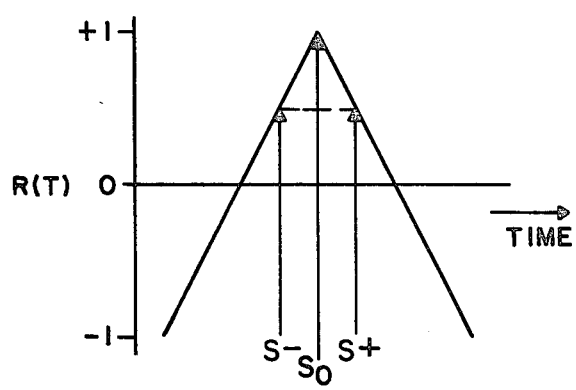
FIG. 5B shows a peak of the autocorrelation function of the interfering signal and a sample taken substantially at such peak.

To assure that the middle strobe $S_\phi$ occurs at the peak of the autocorrelation function of the interfering signal, a switchable bandwidth control loop which will be described later is employed to drive to zero the difference between the autocorrelation function value of the $S_-$ auxiliary strobe with respect to the $S_z$ strobe and the autocorrelation function value of the $S_+$ strobe with respect to the $S_z$ strobe. For a narrowband interfering signal, the autocorrelation function is symmetric about its maxima and minima. Thus, as graphically shown in FIG. 5B, varying the timing of the strobes $S_-$, $S_\phi$ and $S_+$ until the autocorrelation function values corresponding to the $S_-$ and $S_+$ strobes are equal results in the $S_\phi$ strobe occurring at the peak of the autocorrelation function. When the autocorrelation function values corresponding to the $S_-$ and $S_+$ samples are equal, their difference is zero which signifies optimal timing of the $S_\phi$ sample. The larger the difference, the larger is the $S_\phi$ sampling timing error. The switchable bandwidth control loop exhibits a first relatively broad bandwidth as the above autocorrelation function value difference is being driven to zero and exhibits a second relatively narrow bandwidth as the difference approaches and substantially equals zero. This desirably allows a fast initial "attack" time during which the peak of the autocorrelation function is determined relatively rapidly. By switching to a relatively narrow bandwidth after the timing of the peak of the autocorrelation function of the interfering signal has been closely approximated, the peak of such autocorrelation function is tracked with reduced error.

The second mode includes a submode 2A which is employed to achieve ultra-fine tuning of the interfering signal, that is, timing the center strobe $S_\phi$ such that the probability of the center strobe occurring at the peak of the autocorrelation function is approximately 100%. Submode 2A is activated when the signal strength of the received interfering signal is very high. For such high magnitude interfering signals it is noted that the peaks of the resultant autocorrelation function closely approach ±1. As already discussed, in such cases the autocorrelation function approaches a true triangle wave. Therefore, when the interfering signal exhibits a high magnitude, the estimate of the autocorrelation function value at the $S_\phi$ strobe is used to precisely determine a peak of the autocorrelation function. More specifically, whenever the autocorrelation function of the $S_\phi$ strobe exceeds a predetermined value very close to the 1 value of the autocorrelation function peak, then the timing of the $S_\phi$ strobe is deemed to be coincident with the peak of the autocorrelation function. According to the present invention, when this condition occurs, the above-mentioned control loop is disabled, thereby resulting in the center sampling strobe $S_\phi$ remaining at the peak of the autocorrelation function of the interfering signal as desired. However, if the autocorrelation function value corresponding to the center strobe $S_\phi$ falls below a second selected threshold, a cessation of interference is indicated. When the interfering signal thus becomes absent, the initial sense first mode is resumed.

To briefly summarize, the method of the present invention for determining the frequency of a first radio frequency signal includes the steps of receiving the first signal and sampling the first signal at a predetermined number of points in time sufficient to enable determination of a selected number of autocorrelation function values of the first signal. A plurality of first signal autocorrelation function values are generated from the samples of the first signal. The autocorrelation function value having the largest magnitude is selected. Indicia of the approximate frequency of the first signal is provided by the time associated with the first signal sample corresponding to the selected autocorrelation function value having the largest magnitude. The timing of the first signal samples is varied until the selected sample corresponding to the autocorrelation function value of largest magnitude occurs at the peak of the first signal autocorrelation function.

FIG. 6 shows a Loran C receiver apparatus for receiving a Loran C signal and for determining the frequency of a relatively narrow bandwidth interfering signal corrupting the desired Loran C signal. The Loran C signal receiving apparatus includes an antenna 10, preferably omnidirectional, coupled to the input of an RF bandpass filter 20. Filter 20 exhibits a bandwidth commensurate with the frequencies of the Loran C signals for which reception is desired. For example, filter 20 typically exhibits a bandpass from 90 to 110 kHz. The output of bandpass filter 20 is coupled to the input of a hard-limiting amplifier 30. Limiter 30 acts to "square up" the positive and negative peaks of the Loran C signals and interfering signals passing therethrough such that a +1 output signal is provided for positive input signals and a −1 output signal is provided for negative input signals. Thus, signals appearing at the output of limiting amplifier 30 have an instantaneous value of either +1 or −1. The output of limiting amplifier 30 is coupled to the input of a sampling circuit 40. Sampling circuit 40 samples the incoming Loran C and interfering signals at selected times determined by an electronic processor 50, typically a microprocessor (MPU), coupled thereto. A control lead connects processor 50 to sampling circuit 40 as shown in FIG. 6 instruct sampling circuit 40 to take samples at the appropriate times discussed subsequently. Electronic processor 50 is appropriately programmed to instruct sampling circuit 40 to sample the incoming Loran C pulses at the PTR's thereof. Electronic processor 50 instructs sampling circuit 40 to sample the incoming Loran C signal at each PTR, thus forming a continuous stream of $S_z$ samples which are fed into processor 50. Electronic processor 50 further instructs sampling circuit 40 to sample the incoming signal at a plurality of times prior to each $S_z$ sample (that is, prior to each Loran C pulse) to generate a set of a plurality of samples of the interfering signal corresponding to each $S_z$ sample. Alternatively, processor 50 instructs sampling circuit 40 to sample the incoming interfering signal at a plurality of times after each $S_z$ sample (that is, after each Loran C pulse). In the preferred embodiment of the invention, eight samples, namely $S_1$ through $S_8$ comprise the set of samples taken prior to each $S_z$ sample of each Loran C pulse. The $S_1$ through $S_8$ interfering signal samples are continually fed to electronic processor 50. These samples are taken regardless of the actual presence of an interfering signal.

A mode 1 interfering signal detection circuit 100 is coupled to electronic processor 50 as shown in FIG. 6. Interfering signal detection circuit 100 operates in a first mode to determine if an interfering signal has been received which exceeds a predetermined threshold level. More specifically, detection circuit 100 includes a multiplier 110 for determining the products of the $S_z$ sample with respect to each of the $S_1$ through $S_8$ samples taken by sampling circuit 40 prior to each Loran C pulse. The input of multiplier 110 is coupled to electronic processor 50 in an appropriate manner to receive each $S_z$ sample with its corresponding $S_1$ through $S_8$ interfering signal samples. Multiplier 110 includes a plurality of outputs, one output being provided for each of the eight products. Although in FIG. 6 the output of multiplier 110 is conveniently shown as a single data bus, to be more specific, the overall output of multiplier 110 includes eight individual outputs. Thus, a first output within the output data bus carries the product $(S_z)(S_1)$. A second output of multiplier 110 carries the product $(S_z)(S_2)$ and so forth through an eighth multiplier 110 output which carries a product $(S_z)(S_8)$. The eight outputs of multiplier 110 are respectively coupled to the eight inputs of a bank of eight accumulators 120, each accumulator of bank 120 corresponding to a respective multiplier 110 output on a one-to-one basis. For every number of Loran C pulses L the accumulators of accumulator bank 120 accumulate the total sums of the respective products input thereto during the occurrence of each group of L pulses. Since the maximum peak value that any of the samples $S_z$ or $S_1$ through $S_8$ may exhibit is $\pm 1$, the maximum value each of the above-mentioned products formed by multiplier circuit 110 may exhibit is likewise $\pm 1$. Thus, since accumulator bank 120 is accumulating over L pulses, the maximum total value which any individual accumulator may reach in the course of accumulating over such L pulses is $\pm L$. Typically the value of L is 120. Accumulators 120 may be set to accumulate products during more than or less than 120 Loran C pulses depending on the accuracy of interference detection and the speed of detection desired.

A bank of absolute value circuits 130 are respectively connected to the outputs of accumulator bank 120, one absolute value circuit being coupled to each output of accumulator bank 120 such that the accumulated total from each accumulator of bank 120 exhibits a positive polarity. A hard limiter 135 is also coupled to the outputs of accumulator bank 120. The output of limiter 135 is coupled to electronic processor 50 such that processor 50 is provided polarity data for each of the products accumulated by accumulator bank 120. The polarity of each of the autocorrelation function values determined by accumulator bank 120 is thus known to processor 50.

A maximum value selection circuit 140 having a plurality of inputs equal to the number of absolute value circuits of bank 130 is coupled to bank 130, each input of selection circuit 140 being coupled to a respective output of bank 130. For convenience, such coupling is shown in FIG. 6 as a data bus between absolute value circuit bank 130 and selection circuit 140. Selection circuit 140 has a number of inputs equal to the number of samples per Loran C pulse of the interfering signal, namely in this embodiment, eight ($S_1$ through $S_8$). Maximum value selection circuit 140 selects the accumulated product representing the autocorrelation function value R(T) which has the largest absolute value and provides this product to output 140A. Selection circuit 140 includes another output 140B coupled to electronic processor 50 in such a manner as to provide processor 50 with information as to the time T corresponding to the sample of the $S_1$ through $S_8$ sample set which yields the largest accumulated autocorrelation function value over L (here 120) Loran C signal pulses. This information is conveniently stored in a memory (not shown) included in processor 50. Mode 1 circuit 100 thus essentially determines the autocorrelation function value for each of the samples $S_1$ through $S_8$ over 120 Loran C signal pulses and, by action of selection circuit 140, determines which of these autocorrelation functions exhibits the largest magnitude. The sample from the $S_1$ through $S_8$ sample set which corresponds to this largest autocorrelation function value occurs closest in time to the peak of the autocorrelation function. From previous discussion, it is noted that the time T between the peak of the autocorrelation function of the interfering signal and the $S_z$ sample exhibits indicia of the frequency of the interfering signal.

The output 140A of maximum value selection circuit 140 is coupled to the input of a comparator 150 such that the largest autocorrelation function value selected by circuit 140 is provided to comparator 150 and compared with a predetermined threshold level. If the largest autocorrelation function value determined by circuit 140 exceeds the preselected threshold value, for example, 48 in one embodiment (out of a possible maximum of 120, that is, L), then interference is deemed to be present and is indicated by an output signal fed by comparator 150 to processor 50. When this condition occurs, the electronic processor 50 causes the frequency determining apparatus of FIG. 6 to proceed to a second mode. However, If interference is not deemed to be received, that is, if the largest autocorrelation function value determined during a group of L (here 120) Loran C pulses does not exceed such predetermined threshold level, then processor 50 continues to operate in the first mode. When continuing to operate in the first mode, each of the accumulators of accumulator bank 120 is reset to zero after each group of L (120) Loran C pulses.

A mode 2 circuit 200 for more accurately determining indicia of the frequency of the interfering signal is coupled to electronic process 50 as shown in FIG. 6. More specifically, mode 2 circuit 200 includes a multiplier 210 coupled to processor 50 in such a manner as to receive selected samples $S_-$, $S_+$ and $S_z$ stored in processor 50. It is remembered that in the first mode the sample of the $S_1$ through $S_8$ sample set occurring closest in time to the peak of the autocorrelation function of the interfering signal was selected and stored in processor 50. The mode 1 circuit 100 is instructed by processor 50 to make such selection from the inner samples of sample set $S_1$ through $S_8$, namely from one of samples $S_2$, $S_3$, $S_4$, $S_5$, $S_6$ and $S_7$. This sample from the $S_2$ through $S_7$ set occurring closest in time to the peak of the autocorrelation function is now designated $S_\phi$. As seen in FIG. 5A, the sample occurring immediately after the $S_\phi$ sample is designated $S_+$ and the sample occurring immediately before the $S_\phi$ sample is designated $S_-$. As already discussed, the sample taken at the PTR is designated $S_z$. In accordance with the foregoing, when the mode 2 circuit 200 is activated, for each $S_1$ determined by mode 1 circuit 100, the corresponding adjacent $S_-$ and $S_+$ samples are fed to multiplier circuit 210. The current $S_z$ value is also fed to multiplier circuit 210. Multiplier 210 determines the product $(S_-)(S_z)$ and the product $(S_+)(S_z)$ and provides these products to the input of a difference circuit 220 which determines the difference between these products and provides such difference at its output. As previously explained, this difference gives an indication of how far erroneously removed in time the $S_\phi$ sample is from the peak of the autocorrelation function. Again, it is desired that the $S_\phi$ sample occur at the peak of the autocorrelation function. Difference circuit 220 is in actuality determining the difference between the autocorrelation function values corresponding to the $S_-$ samples and the $S_+$ samples. The smaller this difference is, the closer is the $S_\phi$ strobe to the peak of the autocorrelation function of the interfering signal.

A multiplier 225 is coupled to the output of difference circuit 220 and to processor 50 via a control lead 226 as shown. Multiplier 225 multiplies the output signal of difference circuit 220 by $+1$ or $-1$ when so instructed by processor 50. More specifically, when the polarity of the autocorrelation function values of the interfering signal is positive as indicated to processor 50 by hard limiter 135, processor 50 causes multiplier 225 to multiply the output signal of difference circuit 220 by $+1$. If the polarity of the autocorrelation function values of the interfering signal is negative according to hard limiter 135, processor 50 instructs multiplier 225 to multiply the output signal of difference circuit 225 by $-1$. Thus, the difference signal between the two products $(S_-)(S_z)$ and $(S_+)(S_z)$ is provided the appropriate sign $\pm 1$ according to the polarity of the autocorrelation function values comprising such products.

Initially the difference of the products is accumulated for K number of Loran C pulses in accumulator 230 which is coupled to the output of difference circuit 220. The accumulated output of accumulator 230 yields an indication of the amount of error in the timing of the $S_\phi$ strobe. This accumulated total of product differences is provided to the input of a digital switchable bandwidth filter 240. Switchable bandwidth filter 240 subjects the accumulated product differences provided by accumulator 230 to a relatively broad bandwidth filtering action for the first K pulses operated on by mode 2 circuit 200. Typically an initial value of K is 24. After each group of K Loran C pulses, accumulator 230 is reset to zero by action of a signal from processor 50 coupled to accumulator 230 by the accumulator control line 231 shown in FIG. 6. While the first J groups (J is a number, typically 36) of K Loran C pulses are operated on by mode 2 circuit 200, digital switchable bandwidth filter 240 maintains the above-mentioned relatively broad bandwidth filtering characteristic. However, after mode 2 circuit 200 operates on the first J groups of K Loran C pulses, accumulator 230 is reset to zero and initializes accumulation again for a substantially larger number of Loran C pulses than K equals 24, for example, K equals 720. While mode 2 circuit 200 is operating on this second larger number of K Loran C pulses, the digital switchable bandwidth filter 240 is switched to exhibit a narrower bandwidth filter than it exhibited initially for the first J groups of K pulses. The above parameter changes are accomplished by appropriate control signals issued by processor 50 to accumulator 230 and filter 240 on respective control lines 231 and 241. The output signal of switchable bandwidth filter 240 is an error signal which gives an indication of how far removed in time the $S_\phi$ sampling strobe is from the peak of the autocorrelation function. The output of filter 240 at which such error signal is present is coupled via electronic processor 50 to sampling circuit 40 to control and adjust the sampling times of sampling circuit 40 until the selected $S_\phi$ sample within the $S_1$ through $S_8$ sample set occurs at the peak of the autocorrelation function of the interfering signal. Thus, mode 2 circuit 200, processor 50 and sampling circuit 40 together form a control loop which operates to optimally time the $S_\phi$ sampling strobe.

The initial parameter K equals 24 selected for accumulator 230 and the corresponding relatively broad bandwidth exhibited by filter 240 under such conditions results in a relatively fast attack or rise time during which the $S_\phi$ sample is positioned in time near the peak of the autocorrelation function. However, the subsequent parameter K equals 720 selected for accumulator 230 and the corresponding relatively narrow bandwidth exhibited by filter 240 under such condition results in an increasingly accurate error signal being provided to processor 50 and associated sampling circuit 40 as the optimal timing of the $S_\phi$ sample is zeroed in on. As the accuracy of the $S_\phi$ sample tracking with the peak of the autocorrelation function of the interfering signal becomes greater, the error signal at the output of filter 240 becomes correspondingly lesser and eventually approaches zero as maximum accuracy is obtained.

A mode 2A circuit 300 is coupled to electronic processor 50 to achieve ultra-fine tuning of the $S_\phi$ sample such that the $S_\phi$ sample corresponds in time with the peak of the autocorrelation function of the interfering signal as closely as possible. More specifically, mode 2A circuit 300 includes a multiplier 310 coupled to electronic processor 50 so as to continuously receive the current $S_\phi$ and $S_z$ samples determined by the mode 1 and mode 2 circuits 100 and 200 and associated circuitry. Multiplier 310 performs the initial step required for determining the autocorrelation function value of the $S_\phi$ samples with respect to the corresponding $S_z$ samples of the Loran C pulses. More specifically, multiplier 310 accomplishes this by multiplying each $S_\phi$ sample by the corresponding $S_z$ sample for each Loran C pulse. Each $(S_\phi)(S_z)$ product thus determined is provided to the input of an accumulator 320 which accumulates $(S_\phi)(S_z)$ products for a number of M Loran C pulses where M equals 720, for example. It is noted that since the highest value each $(S_\phi)(S_z)$ product may attain is $\pm 1$, the highest value which may be generated at the output of accumulator 320 is $\pm 720$ or plus or minus the value selected for M.

The output of accumulator 320 is coupled to the input of an absolute value circuit 330 to assure that the accumulated output of accumulator 320 exhibits a positive polarity prior to comparison with predetermined threshold levels as explained subsequently. The output of absolute value circuit 330 is coupled to the input of a comparator 340. Comparator 340 compares the accumulated total of $(S_\phi)(S_z)$ products with a predetermined threshold near the value of M selected for accumulator 320. For example, if M equals 720, a typical value of the threshold level associated with comparator 340 is 715. If the accumulated total from accumulator 320 exceeds this threshold level, here 715, extreme correlation between the $S_\phi$ samples and the $S_z$ samples is indicated. Under this condition comparator 340 produces an output signal which operates to disable digital switchable bandwidth filter 240 via a connection between the comparator 340 output and a disable terminal of filter 240 as seen in FIG. 6. As already discussed in the description of the method of the invention, such disabling of the digital switchable bandwidth filter 240 desirably allows the highly accurately timed $S_\phi$ samples to remain undisturbed at the desired precise timing at the peak of the autocorrelation function. Ultra-fine tuning of the $S_\phi$ sampling strobe is thus achieved. The amount of time between the $S_\phi$ strobe and the $S_z$ strobe at the PTR therefore exhibits highly accurate indicia of both the period and the frequency of the interfering signal.

The output of absolute value circuit 330 is also coupled to the input of a comparator 350 for determining if the interfering signal has ceased or declined in magnitude to such a low threshold level that interference frequency detection is not desired. Again, it is noted that the maximum accumulated $(S_\phi)(S_z)$ product total which may possibly be provided to the input of comparator 350 equals M (here 720), that is, the number of Loran C pulses upon which accumulator 320 operates before being reset to zero. If the accumulated total of $(S_\phi)(S_z)$ products if substantially less than M, then the interfering signal has either ceased or diminished to such a low level that it may be ignored. For M equals 720, the threshold level of comparator 350 is conveniently set at 288. Comparator 350 operates such that if the accumulated product total is less than or equal to 288, electronic processor 50 then operates to return the apparatus off the invention back to the mode 1 state and the search for an interfering signal is thus reinitiated. (The output of comparator 350 is coupled to electronic processor 50 as shown in FIG. 6.)

It is noted that mode 1 circuit 100, mode 2 circuit 200 and mode 2A circuit 300 may conveniently be incorporated within electronic processor 50. A flowchart illustrating the sequence of operations when such incorporation is employed in the frequency determining apparatus of the present invention is shown in FIGS. 7A–7C.

Figure 7A:
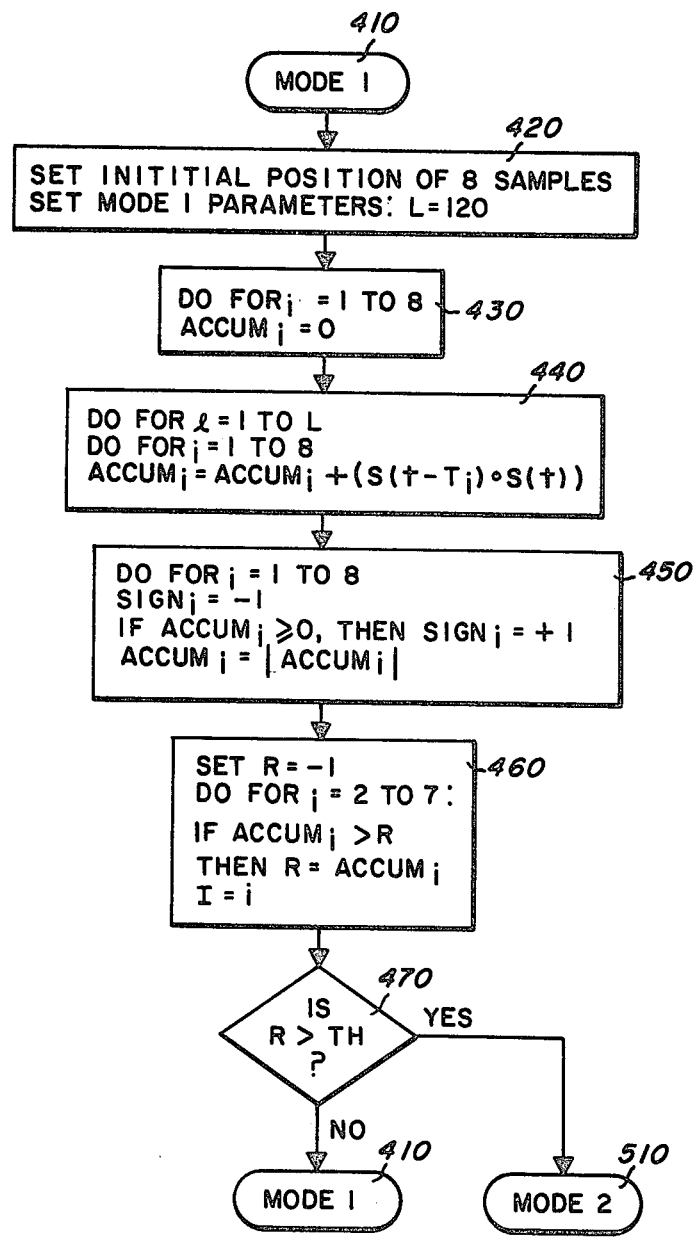
FIG. 7, consisting of 7A–7C, is a flowchart of the operation of the present invention.

FIG. 7A is a flowchart of the Mode 1 portion of the method of the invention. Mode 1 is initialized at step 410 as shown. The times at which sampling circuit 40 takes the initial 8 samples $S_1$–$S_8$ are determined and the Mode 1 parameter L is set at 120 in step 420. Steps 430 and 440 achieve accumulation of $S(t-T_i)\,S(t)$ products, such accumulated products being designated $ACCUM_i$. In the embodiment of FIG. 6, such products are generated by multiplier 110 and are accumulated by accumulator bank 120. Referring again to FIG. 7A, step 450 generates the absolute value of such accumulated products and determines the polarity of such products. These functions are respectively performed by absolute value bank 130 and hard limiter 135. The largest of the accumulated products $S(t-T_i)\cdot S(t)$ is determined in step 460 and is designated R after such maximum value selection occurs. This corresponds to the selection of the autocorrelation function of greatest value by maximum value selection circuit 140. Step 470 determines if such R exceeds a predetermined threshold level TH in a manner akin to the way comparator 150 performs this operation. If R exceeds TH, an interfering signal has been detected and Mode 2 is commenced. If R fails to exceed TH, Mode 1 is continued by returning to step 410.

Figure 7B:
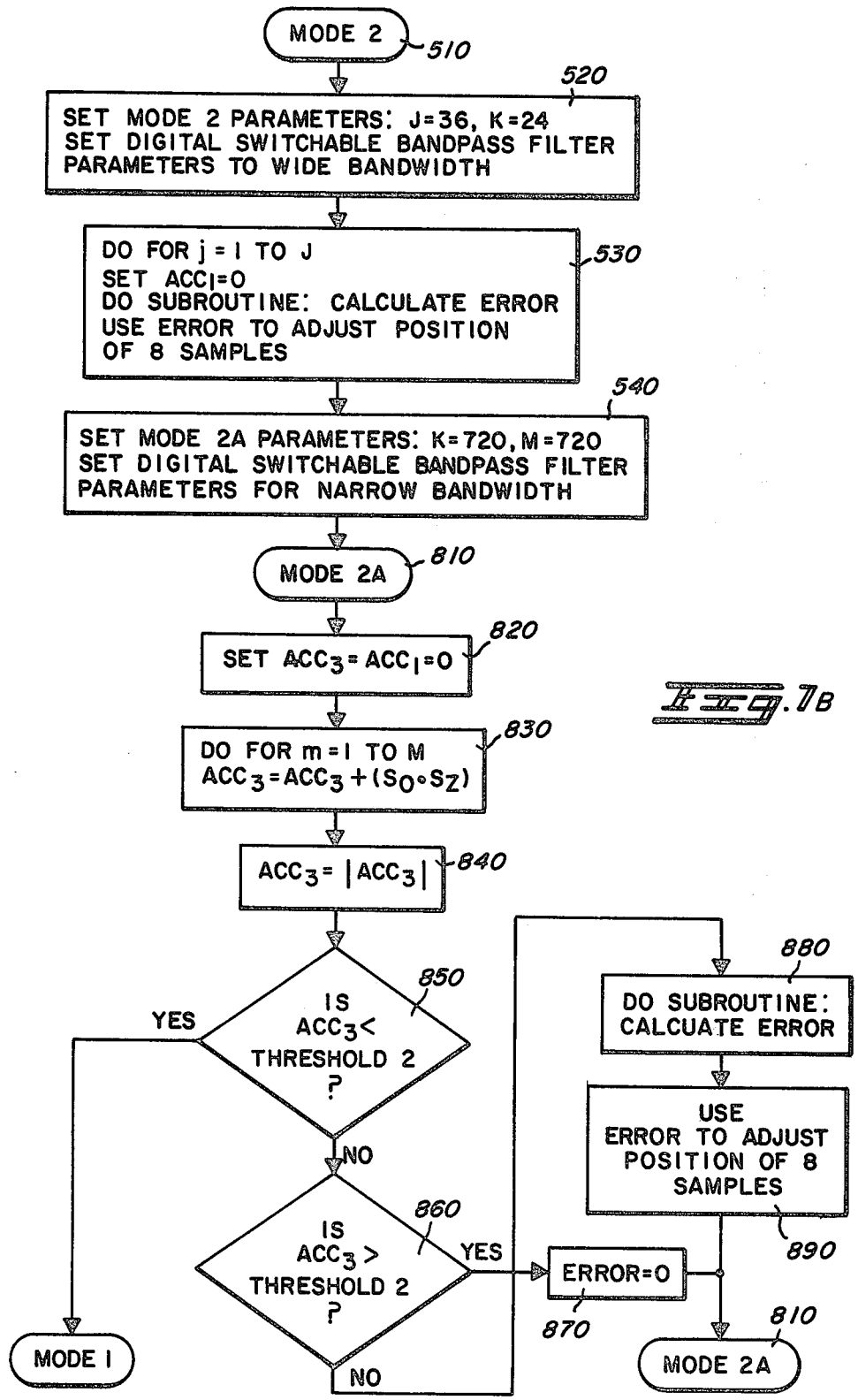
Figure 7C:
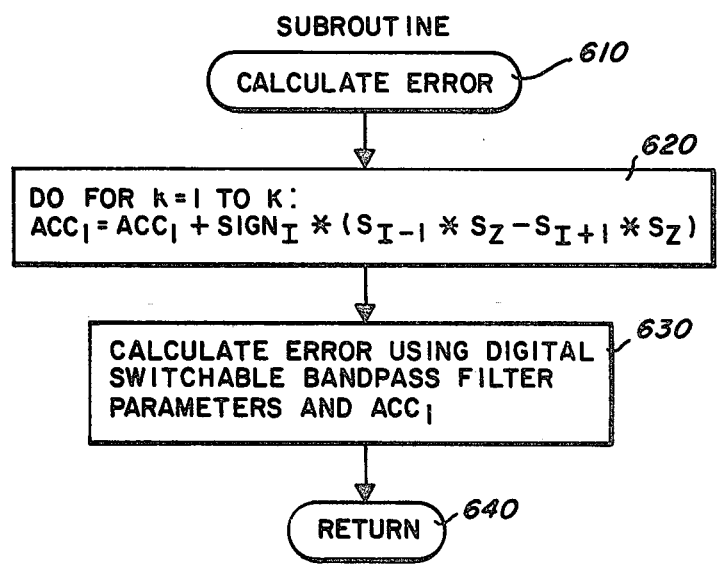

FIG. 7B is a flowchart of the Mode 2 portion of the method of the invention. Mode 2 is initialized at step 510. The parameters J and K, already discussed, are initialized at 36 and 24 respectively in step 520. Also, the digital switchable bandwidth filter (240) is provided with appropriate parameters to cause it to exhibit a wide bandwidth in step 520. ACC 1 is set to zero in step 530. This is the equivalent of setting accumulator 230 to zero in FIG. 6. Step 530 proceeds to a subroutine CALCULATE ERROR (step 610) which determines the amount of error in the sampling strobe closest to the peak of the autocorrelation function of the interfering signal. As seen in step 620 of FIG. 7C, $ACC_1 = ACC_1 + SIGN_I^* \ (S_{I-1}^*S_z - S_{I+1}^*S_z)$. This expression is readily understood in light of the previous discussion of Mode 2, specifically, multiplier 210, difference circuit 220, multiplier 225, accumulator 230 and filter 240 thereof. $S_{I-1}$ and $S_{I+1}$ are defined to be the $S_-$ and $S_+$ samples, respectively. $S_z$ is the current PTR estimate. $SIGN_I$ is polarity information like that provided by hard limiter 135. The expression just recited for $ACC_1$ provides an error signal when accumulated from $k=1$ to K in step 620 under the present selected digital switchable bandpass filter parameter referred to in step 630. This error signal contains indicia of how far removed in time the $S_\phi$ strobe is from the peak of the autocorrelation function of the interfering signal. Step 640 executes a return causing the subroutine to return operation to the end of step 530 in Mode 2. The Mode 2A parameters K and M are both set to 720 in step 540. The digital switchable bandwidth filter (240) is provided with appropriate parameters in step 540 to cause it to exhibit a narrow bandwidth.

Mode 2A is initiated in step 810. $ACC_1$ and $ACC_3$ are set to zero in step 820. $ACC_3$ is defined to equal $ACC_3 + (S_\phi^*S_z)$ when accumulated from $m=1$ to M as in step 830. Multiplier 310 and accumulator 320 cooperate to achieve this result in the apparatus of FIG. 6. The absolute of $ACC_3$ is determined in step 840 in a manner similar to the function of absolute value circuit 330. Decision step 850 determines if $ACC_3$ is less than a predetermined threshold THRESH 2. If such is the case, Mode 1 is implemented again. If $ACC_3$ is not less than such threshold, a further decision step 860 is implemented in which $ACC_3$ is compared with another threshold THRESH 1. Such comparisons are in effect implemented by comparator 340 and 350. If $ACC_3$ is greater than THRESH 1, then ERROR is determined to be zero as per step 870. In such case of no error, the timing of the eight sampling strobes $S_1$–$S_8$ is proper and no time adjustment is required in step 890. However, if $ACC_3$ is greater than THRESH 1, error in the timing of the $S_1$–$S_8$ sampling strobes, specifically $S_\phi$, is present. In this event, such error is calculated by subroutine CALCULATE ERROR as per step 880. After the error is calculated in the subroutine, the known error is used to adjust the position, that is, timing of the $S_1$–$S_8$ samples such that the $S_\phi$ sample is properly timed.

The foregoing describes an apparatus and method for determining the presence and frequency of a signal interfering with a desired pulsed signal or Loran C signal. The apparatus and method may further be employed for determining the frequency of virtually any periodic signal. The apparatus and method of the invention operates to determine indicia of the frequency of an interfering signal even if the interfering signal exhibits a frequency substantially the same as the desired pulsed signal.

While only certain preferred features of the invention have been shown by way of illustration, many modifications and changes will occur to those skilled in the art. It is, therefore, to be understood that the present claims are intended to cover all such modifications and changes as fall within the true spirit of the invention.

We claim:

1. Apparatus for determining the frequency of a first radio frequency signal comprising:
   receiving means for receiving said first signal;
   sampling means, coupled to said receiving means, for sampling said first signal at a first predetermined time and periodically thereafter to generate a plurality of first samples and for sampling said first signal at a plurality of times during each of the time intervals between first samples to generate a plurality of second samples thus forming second sample sets;

autocorrelation function generating means, coupled to said sample means, for generating the autocorrelation function value of the second samples of the second sample sets with respect to the first samples;

selecting means coupled to said autocorrelation function generating means, operative in a first mode for determining selected samples of said second sample sets which yield an autocorrelation function value of largest magnitude when autocorrelated with respective first samples by said autocorrelation function generating means, the time periods between said selected samples and respective first samples exhibiting indicia of the frequency of the first signal.

2. The apparatus of claim 1 including comparator means coupled to said selecting means for causing said apparatus to operate in a second mode if said autocorrelation function value of largest magnitude exceeds a predetermined threshold level.

3. The apparatus of claim 2 including error signal generating means operatively coupled to said sampling means, for operating in a second mode to vary the time at which the samples of said first signal are taken until the sample corresponding to the autocorrelation function value of largest magnitude determined in the first mode occurs at a peak value of the autocorrelation function.

4. The apparatus of claim 3 wherein said error signal generating means comprises feedback loop means for determining the difference between the product $(S_-)(S_z)$ and the product $(S_+)(S_z)$ and for generating an error signal proportional to such difference wherein $S_-$ equals the sample of said second sample set generated immediately prior to the selected sample corresponding to the autocorrelation function value of largest magnitude, $F_+$ equals the sample of said second sample set generated immediately after the selected sample corresponding to the autocorrelation function value of largest magnitude and $S_z$ equals the samples of said first signal generated at said first predetermined time and periodically thereafter.

5. The apparatus of claim 4 wherein said receiving means is adapted to receive a second radio frequency signal of Loran C pulses with which said first signal interferes and includes hard-limiting means for hard-limiting signals provided to said receiving means.

6. The apparatus of claim 5 wherein said sampling means is adapted to generate the $S_z$ samples at respective pulse tracking reference (PTR) points of the Loran C signal pulses.

7. The apparatus of claim 1 wherein said receiving means is adapted to receive a second radio frequency signal of Loran C pulses with which said first signal interferes and includes hard-limiting means for hard-limiting signals provided to said receiving means.

8. The apparatus of claim 7 wherein said sampling means is adapted to generate the first samples of said first signal at respective pulse tracking reference (PTR) points of the Loran C signal pulses.

9. Apparatus for determining the frequency of a first radio frequency signal interfering with a second signal including a plurality of radio frequency pulses comprising:

receiving means for receiving said first and second signals;

sampling means, coupled to said receiving means, for sampling said first signal at a first predetermined time and periodically thereafter to generate a plurality of first samples, each of said first samples being taken when the instantaneous value of said second signal substantially equals zero, and for sampling said first signal at a plurality of times during each of the intervals between first samples to generate a plurality of second samples thus forming second sample sets, said second sample sets being generated at times other than during said second signal pulses;

autocorrelation function generating means, coupled to said sampling means, for generating the autocorrelation function value of the second samples of the second sample sets with respect to the first samples; and selecting means coupled to said autocorrelation function generating means, operative in a first mode for determining selected samples of said second sample sets which yield an autocorrelation function value of largest magnitude when autocorrelated with respective first samples by said autocorrelation function generating means, the time periods between said selected samples and respective first samples exhibiting indicia of the frequency of the first signal.

10. The apparatus of claim 9 including comparator means coupled to said selecting means for causing said apparatus to operate in a second mode if said autocorrelation function value of largest magnitude exceeds a predetermined threshold level.

11. The apparatus of claim 10 including error signal generating means operatively coupled to said sampling means, for generating in a second mode to vary the time at which the samples of said first signal are taken until the sample corresponding to the autocorrelation function value of largest magnitude determined in the first mode occurs at a peak value of the autocorrelation function.

12. The apparatus of claim 11 wherein said second signal comprises a Loran C signal.

13. A method for determining the frequency of a first radio frequency signal comprising:

receiving said first radio frequency signal;

sampling said first signal at a first predetermined time and periodically thereafter to generate a plurality of first samples;

sampling said first signal at a plurality of times during each of the time intervals between first samples to generate a plurality of second samples thus forming second sample sets;

generating the autocorrelation function value of the second samples of said second sample sets with respect to a respective first sample selecting the second samples of said second sample sets wich yield an autocorrelation function value of largest magnitude when autocorrelated with respective first samples thus generating selected second samples, the time periods between said selected second samples and respective first samples exhibiting indicia of the frequency of first signal.

14. The method of claim 13 wherein a second radio frequency signal of the Loran C type including PTR's is received by a receiving means, said first signal being a signal interfering with said second signal, said sampling of said first signal being timed such that such sampling occurs approximately at the PTR's of said second signal, the samples resulting therefrom being designated $S_z$.

15. The method of claim 14 wherein the steps of claim 13 comprise operation in a first mode, and including the step of switching to a second mode when said autocorrelation function value of largest magnitude exceeds a first predetermined threshold level, said second mode providing for the more accurate determination of the frequency of said first signal.

16. The method of claim 15 wherein said second mode includes the step of repetitively sampling said first signal at at least three uniformly spaced points in time to form in sequence, samples $S_-$, $S_\phi$ and $S_+$, the $S_\phi$ sample being the first signal sample corresponding to the autocorrelation function of largest magnitude and further including the step of varying the time at which said $S_-$, $S_\phi$ and $S_+$ samples occur until the average difference between the products $(S_-)(S_z)$ and $(S_+)(S_z)$ equals $\phi$.

17. The method of claim 16 wherein said second mode operates to periodically accumulate the difference between the products $(S_-)(S_z)$ and $(S_+)(S_z)$ as said first signal is repetitively sampled and including the step of filtering the accumulated differences thus formed with a filter of first selected bandwidth and filtering the accumulated differences with a filter of second bandwidth narrower than the first bandwidth after a preselected number of differences have been filtered.

18. The method of claim 17 including the step of accumulating the absolute value of $(S_\phi)(S_z)$ products and returning to said first mode if the accumulated absolute value of $(S_\phi)(S_z)$ products is less than or equal to a second predetermined threshold and continuing to operate in said second mode but without further varying the time at which said $S_\phi$ sample occurs if said accumulated absolute value of $(S_\phi)(S_z)$ products is equal to or greater than said second predetermined threshold.

* * * * *